United States Patent
Ueda

(10) Patent No.: US 10,812,888 B2
(45) Date of Patent: Oct. 20, 2020

(54) WEARABLE AUDIO DEVICE WITH CAPACITIVE TOUCH INTERFACE

(71) Applicant: Bose Corporation, Framingham, MA (US)

(72) Inventor: Joji Ueda, Cambridge, MA (US)

(73) Assignee: BOSE CORPORATION, Framingham, MA (US)

( * ) Notice: Subject to any disclaimer, the term of this patent is extended or adjusted under 35 U.S.C. 154(b) by 0 days.

(21) Appl. No.: 16/046,542

(22) Filed: Jul. 26, 2018

(65) Prior Publication Data
US 2020/0037058 A1 Jan. 30, 2020

(51) Int. Cl.
*H04R 1/10* (2006.01)
*G06F 3/044* (2006.01)
*G06F 3/01* (2006.01)

(52) U.S. Cl.
CPC .......... *H04R 1/1041* (2013.01); *G06F 3/017* (2013.01); *G06F 3/044* (2013.01); *H04R 1/1016* (2013.01)

(58) Field of Classification Search
CPC .............. G02B 27/017; G02B 27/0176; G02B 27/0178; G02B 27/01; G02B 23/125; G02B 2027/0178; G06F 3/011; G06F 3/012; G06F 3/013; G06F 1/163; G06F 1/1637; G06F 3/016; G06F 3/04815; G06F 2203/012–015; G06F 3/033; G06F 3/0338; G06F 3/0346; G06F 3/0354; G06F 3/014; G06F 3/03543; G06F 3/03541; G06F 2203/0335; G06F 2203/0331; G06F 2203/04108; G06F 2203/0332;
(Continued)

(56) References Cited

U.S. PATENT DOCUMENTS

| | | |
|---|---|---|
| 6,452,494 B1 | 9/2002 | Harrison |
| 7,010,332 B1 | 3/2006 | Irvin et al. |
| 7,805,171 B2 | 9/2010 | Alameh et al. |

(Continued)

FOREIGN PATENT DOCUMENTS

| | | |
|---|---|---|
| CN | 202721822 U | 2/2013 |
| CN | 102761816 B | 9/2014 |

(Continued)

OTHER PUBLICATIONS

PCT International Search Report and Written Opinion for International Application No. PCT/US2019/043605, dated Oct. 23, 2019, 14 pages.

*Primary Examiner* — Nitin Patel
(74) *Attorney, Agent, or Firm* — Hoffman Warnick LLC

(57) ABSTRACT

Various aspects include wearable audio devices. In some particular implementations, a wearable audio device includes: an acoustic transducer having a sound-radiating surface for providing an audio output; a controller coupled with the acoustic transducer; a printed circuit board (PCB) coupled with the controller; and a capacitive touch interface coupled with the PCB, the capacitive touch interface having: a contact surface for receiving a touch command; and a set of at least two electrodes underlying the contact surface for detecting the touch command at the contact surface, where neighboring electrodes in the set share a border having an arcuate profile across the contact surface or a piecewise profile approximating a non-linear path across the contact surface.

13 Claims, 12 Drawing Sheets

(58) Field of Classification Search
CPC ..... G06F 2203/0333; G06F 2203/0334; G06F 2203/0336; H04N 13/332; G06T 19/006
See application file for complete search history.

(56) References Cited

U.S. PATENT DOCUMENTS

| | | | |
|---|---|---|---|
| 7,925,029 B2 | 4/2011 | Hollemans et al. | |
| 7,945,297 B2 | 5/2011 | Philipp | |
| 8,045,727 B2 | 10/2011 | Philipp | |
| 8,315,406 B2 | 11/2012 | Kon | |
| 8,315,876 B2 | 11/2012 | Reuss | |
| 8,335,312 B2 | 12/2012 | Gerhardt et al. | |
| 8,428,053 B2 | 4/2013 | Kannappan | |
| 8,538,009 B2 | 9/2013 | Gerhardt et al. | |
| 8,559,621 B2 | 10/2013 | Gerhardt et al. | |
| RE44,980 E | 7/2014 | Sargaison | |
| 8,798,042 B2 | 8/2014 | Kannappan | |
| 8,805,452 B2 | 8/2014 | Lee | |
| 8,831,242 B2 | 9/2014 | Brown et al. | |
| 8,907,867 B2 | 12/2014 | Wong et al. | |
| 8,954,177 B2 | 2/2015 | Sanders | |
| 9,094,764 B2 | 7/2015 | Rosener | |
| 9,117,443 B2 | 8/2015 | Walsh | |
| 9,124,970 B2 | 9/2015 | Rabii et al. | |
| 9,280,239 B2 | 3/2016 | Rosener | |
| 9,286,742 B2 | 3/2016 | Rosener et al. | |
| 9,338,540 B2 | 5/2016 | Nicholson | |
| 9,479,857 B2 | 10/2016 | Rosener et al. | |
| 9,486,823 B2 | 11/2016 | Andersen et al. | |
| 9,998,817 B1 * | 6/2018 | Liu | H04R 1/1041 |
| 10,484,793 B1 * | 11/2019 | Peterson | G06F 3/0446 |
| 2005/0277446 A1 | 12/2005 | Yueh | |
| 2006/0013079 A1 | 1/2006 | Rekimoto | |
| 2006/0045304 A1 | 3/2006 | Lee et al. | |
| 2006/0233413 A1 | 10/2006 | Nam | |
| 2007/0274530 A1 | 11/2007 | Buil et al. | |
| 2007/0281762 A1 | 12/2007 | Barros et al. | |
| 2007/0297618 A1 | 12/2007 | Nurmi et al. | |
| 2008/0130910 A1 | 6/2008 | Jobling et al. | |
| 2008/0130936 A1 | 6/2008 | Lau et al. | |
| 2008/0143681 A1 * | 6/2008 | XiaoPing | G06F 3/044 345/173 |
| 2008/0260176 A1 | 10/2008 | Hollemans et al. | |
| 2009/0009491 A1 * | 1/2009 | Grivna | G06F 3/033 345/184 |
| 2009/0124286 A1 | 5/2009 | Hellfalk et al. | |
| 2009/0131124 A1 | 5/2009 | Bibaud et al. | |
| 2009/0154720 A1 | 6/2009 | Oki | |
| 2010/0292945 A1 | 11/2010 | Reynolds et al. | |
| 2011/0007908 A1 | 1/2011 | Rosener et al. | |
| 2011/0077056 A1 | 3/2011 | Park et al. | |
| 2012/0086551 A1 | 4/2012 | Lowe et al. | |
| 2012/0244812 A1 | 9/2012 | Rosener | |
| 2012/0306805 A1 * | 12/2012 | Chan | G04G 21/08 345/174 |
| 2013/0082951 A1 | 4/2013 | Tanaka et al. | |
| 2013/0114823 A1 | 5/2013 | Kari et al. | |
| 2013/0121494 A1 | 5/2013 | Johnston | |
| 2013/0279724 A1 | 10/2013 | Stafford et al. | |
| 2015/0177298 A1 * | 6/2015 | Sugiura | G01R 27/2605 324/658 |
| 2015/0358088 A1 * | 12/2015 | Eim | H04M 1/7253 455/418 |
| 2016/0210111 A1 | 7/2016 | Kraft | |
| 2017/0003799 A1 * | 1/2017 | Tateda | H03K 17/9622 |
| 2017/0301314 A1 * | 10/2017 | Kim | G09G 5/10 |
| 2017/0303646 A1 * | 10/2017 | Bricken | H04R 1/028 |
| 2019/0129684 A1 * | 5/2019 | Willis | H04M 1/035 |
| 2019/0294274 A1 * | 9/2019 | Cho | G06F 3/0448 |

FOREIGN PATENT DOCUMENTS

| | | |
|---|---|---|
| CN | 103002373 B | 5/2015 |
| CN | 205071294 U | 3/2016 |
| CN | 205081948 U | 3/2016 |
| EP | 2009949 A1 | 12/2008 |
| GB | 2469796 A | 11/2010 |
| WO | 2010014561 A2 | 2/2010 |
| WO | 2012162979 A1 | 12/2012 |

* cited by examiner

WEARABLE AUDIO DEVICE WITH CAPACITIVE TOUCH INTERFACE

TECHNICAL FIELD

This disclosure generally relates to wearable audio devices. More particularly, the disclosure relates to a capacitive touch interface in wearable audio devices.

BACKGROUND

Wearable audio devices, such as headphones, produce sound for a wearer using an electro-acoustic transducer. These wearable audio devices may take various form factors. In some cases, design, computational and power constraints can limit the interface options for these wearable audio devices. Accordingly, it can be difficult to implement a complete set of interface commands without compromising one or more constraints.

SUMMARY

All examples and features mentioned below can be combined in any technically possible way.

Various implementations of the disclosure include wearable audio devices with a capacitive touch interface. Various particular implementations of the disclosure include an audio headset with at least one earbud including a capacitive touch interface.

In some particular aspects, a wearable audio device includes: an acoustic transducer having a sound-radiating surface for providing an audio output; a controller coupled with the acoustic transducer; a printed circuit board (PCB) coupled with the controller; and a capacitive touch interface coupled with the PCB, the capacitive touch interface including: a contact surface for receiving a touch command; and a set of at least two electrodes underlying the contact surface for detecting the touch command at the contact surface, wherein neighboring electrodes in the set share a border having an arcuate profile across the contact surface or a piecewise profile approximating a non-linear path across the contact surface.

In other particular aspects, an audio headset includes at least one earbud, the earbud having: an acoustic transducer including a sound-radiating surface for providing an audio output; a controller coupled with the acoustic transducer; a printed circuit board (PCB) coupled with the controller; and a capacitive touch interface coupled with the PCB, the capacitive touch interface having: a contact surface for receiving a touch command; and a set of at least two electrodes underlying the contact surface for detecting the touch command at the contact surface, wherein neighboring electrodes in the set share a border having an arcuate profile across the contact surface or a piecewise profile approximating a non-linear path across the contact surface.

Implementations may include one of the following features, or any combination thereof.

In certain aspects, the contact surface further includes a perimeter, and the border between the neighboring electrodes contacts the perimeter at two distinct locations.

In some aspects, the set of at least two electrodes includes at least three electrodes with respective borders between the neighboring electrodes. In particular implementations, the borders between the neighboring electrodes in the at least three electrodes include borders having an arcuate profile and having either a common arc direction or an inverted arc direction.

In certain cases, the piecewise profile includes at least one of: a chevron-shaped profile, a sinusoidal profile along an arcuate path, a saw tooth-shaped profile along an arcuate path or a meandering profile.

In particular aspects, the contact surface achieves a maximum slide angle for the touch command that is greater than a reference slide angle for a reference contact surface having electrodes with border profiles that are linear or approximate a linear border. In some cases, the touch command includes an approximately vertical swiping gesture by a user relative to a ground surface.

In certain implementations, the contact surface has a perimeter shaped as a circle, an ellipse or a rectangle.

In particular cases, the wearable audio device includes at least one of: audio eyeglasses, an earbud, an audio hat, an audio visor, audio jewelry, or a neck-worn speaker system.

In some aspects, the contact surface has an area of less than approximately 90-130 square millimeters.

In some cases where the wearable audio device is an earbud, the earbud is sized to rest within an ear of a user.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
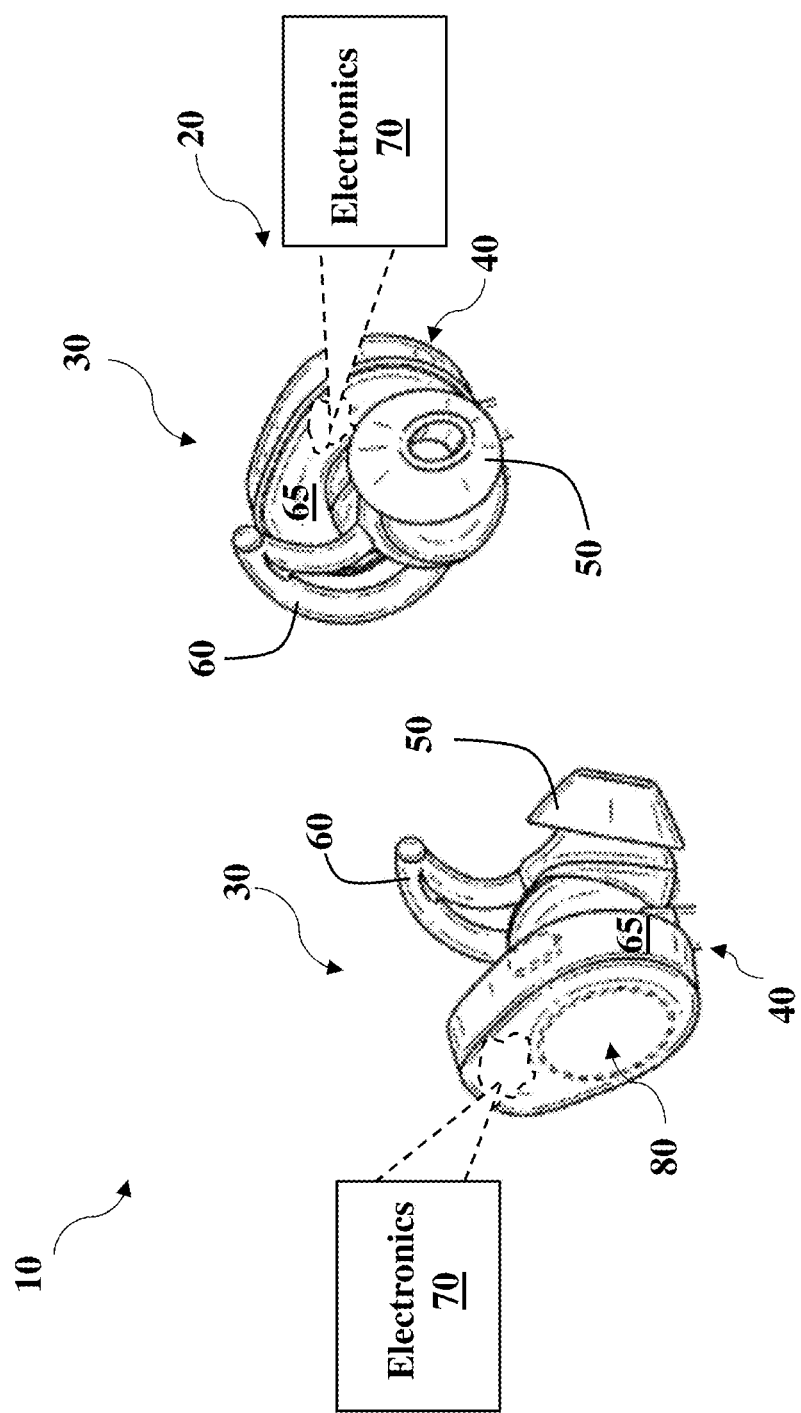
FIG. 1 shows a schematic depiction of a wearable audio device according to various implementations.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to wearable audio devices with a capacitive touch interface. More particularly, aspects of the disclosure relate to wearable audio devices having a capacitive touch interface with electrode borders that enhance slide angle detection when compared with conventional capacitive touch interfaces.

Commonly labeled components in the FIGURES are considered to be substantially equivalent components for the purposes of illustration, and redundant discussion of those components is omitted for clarity.

Aspects and implementations disclosed herein may be applicable to a wide variety of speaker systems, such as wearable audio devices in various form factors, such as headphones (whether on or off ear), headsets, watches, eyeglasses, neck-worn speakers, shoulder-worn speakers, body-worn speakers, etc. Unless specified otherwise, the term wearable audio device, as used in this document, includes headphones and various other types of personal audio devices such as head, shoulder or body-worn acoustic devices that include one or more acoustic drivers to produce sound. Some particular aspects disclosed may be particularly applicable to personal (wearable) audio devices such as in-ear headphones (also referred to as earbuds), eyeglasses or other head-mounted audio devices. It should be noted that although specific implementations of speaker systems primarily serving the purpose of acoustically outputting audio are presented with some degree of detail, such presentations of specific implementations are intended to facilitate understanding through provision of examples and should not be taken as limiting either the scope of disclosure or the scope of claim coverage.

Aspects and implementations disclosed herein may be applicable to speaker systems that either do or do not support two-way communications, and either do or do not support active noise reduction (ANR). For speaker systems that do support either two-way communications or ANR, it is intended that what is disclosed and claimed herein is applicable to a speaker system incorporating one or more microphones disposed on a portion of the speaker system that remains outside an ear when in use (e.g., feedforward microphones), on a portion that is inserted into a portion of an ear when in use (e.g., feedback microphones), or disposed on both of such portions. Still other implementations of speaker systems to which what is disclosed and what is claimed herein is applicable will be apparent to those skilled in the art.

While described by way of example, wearable audio devices such as in-ear headphones (e.g., earbuds), audio accessories or clothing (e.g., audio hats, audio visors, audio jewelry, neck-worn speakers or audio eyeglasses (also referred to as eyeglass headphones) herein, the wearable audio devices disclosed herein can include additional features and capabilities. That is, the wearable audio devices described according to various implementations can include features found in one or more other wearable electronic devices, such as smart glasses, smart watches, etc. These wearable audio devices can include additional hardware components, such as one or more cameras, location tracking devices, microphones, etc., and may be capable of voice recognition, visual recognition, and other smart device functions. The description of wearable audio devices included herein is not intended to exclude these additional capabilities in such a device.

Various particular implementations include wearable audio devices, such as earbuds, and user interfaces for improving gesture detection on those user interfaces when compared with conventional devices. In certain implementations, the wearable audio device includes a capacitive touch interface with a contact surface and a set of (at least two) electrodes underlying the contact surface for detecting a touch command. Neighboring electrodes in the set of electrodes share a border with either an arcuate profile across the contact surface, or a piecewise profile approximating a non-linear path across the contact surface. The electrodes are aligned directly adjacent one another and have complementary faces matching the border, such that the contact surface detects motion as a user moves across the surface from one electrode to the neighboring electrode. The border profile does not approximate a linear path, thereby providing a larger maximum slide angle between the electrodes when compared with conventional multi-electrode capacitive touch interfaces.

Figure 2:
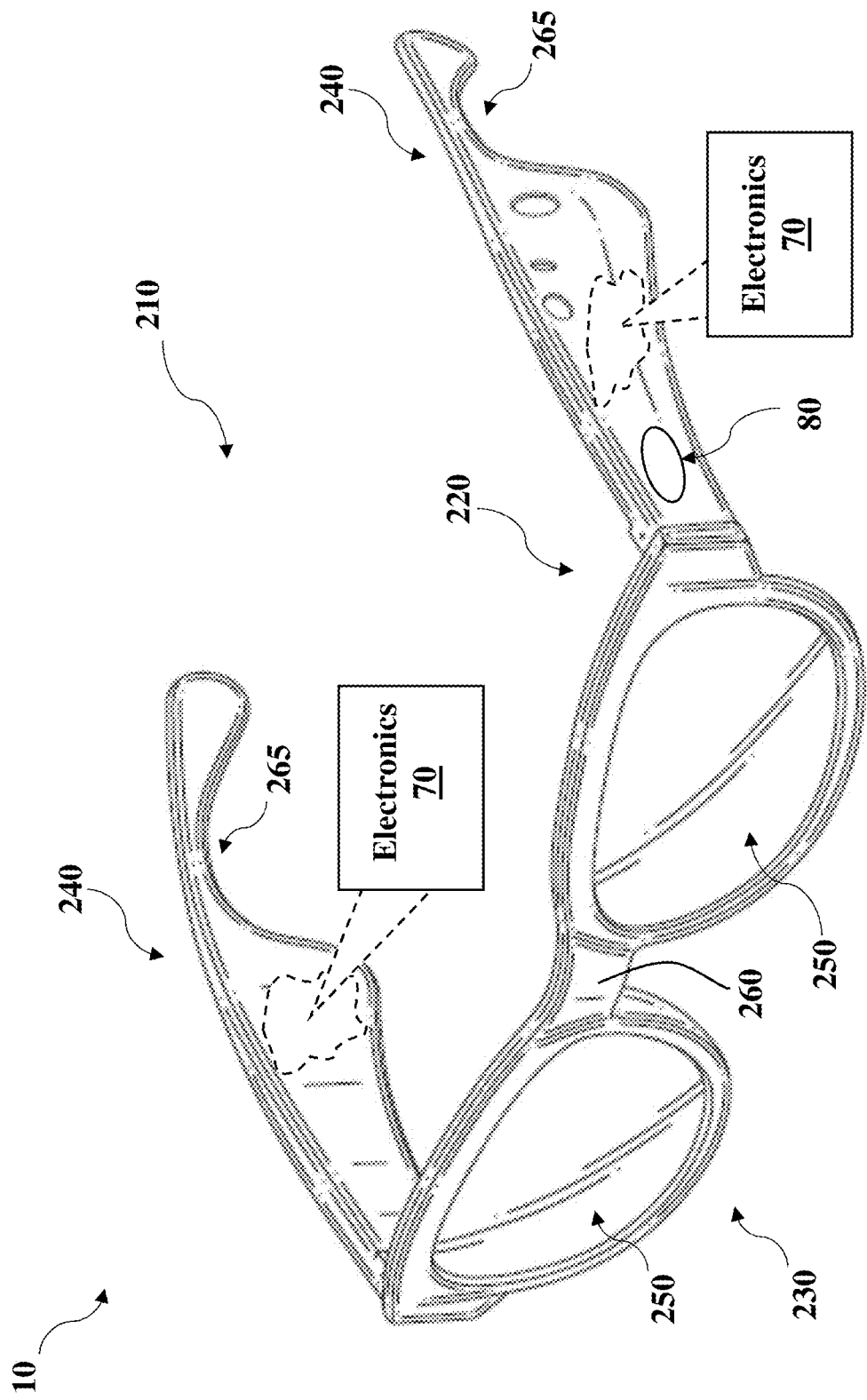
FIG. 2 is a schematic depiction of an additional wearable audio device according to various implementations.
Figure 3:
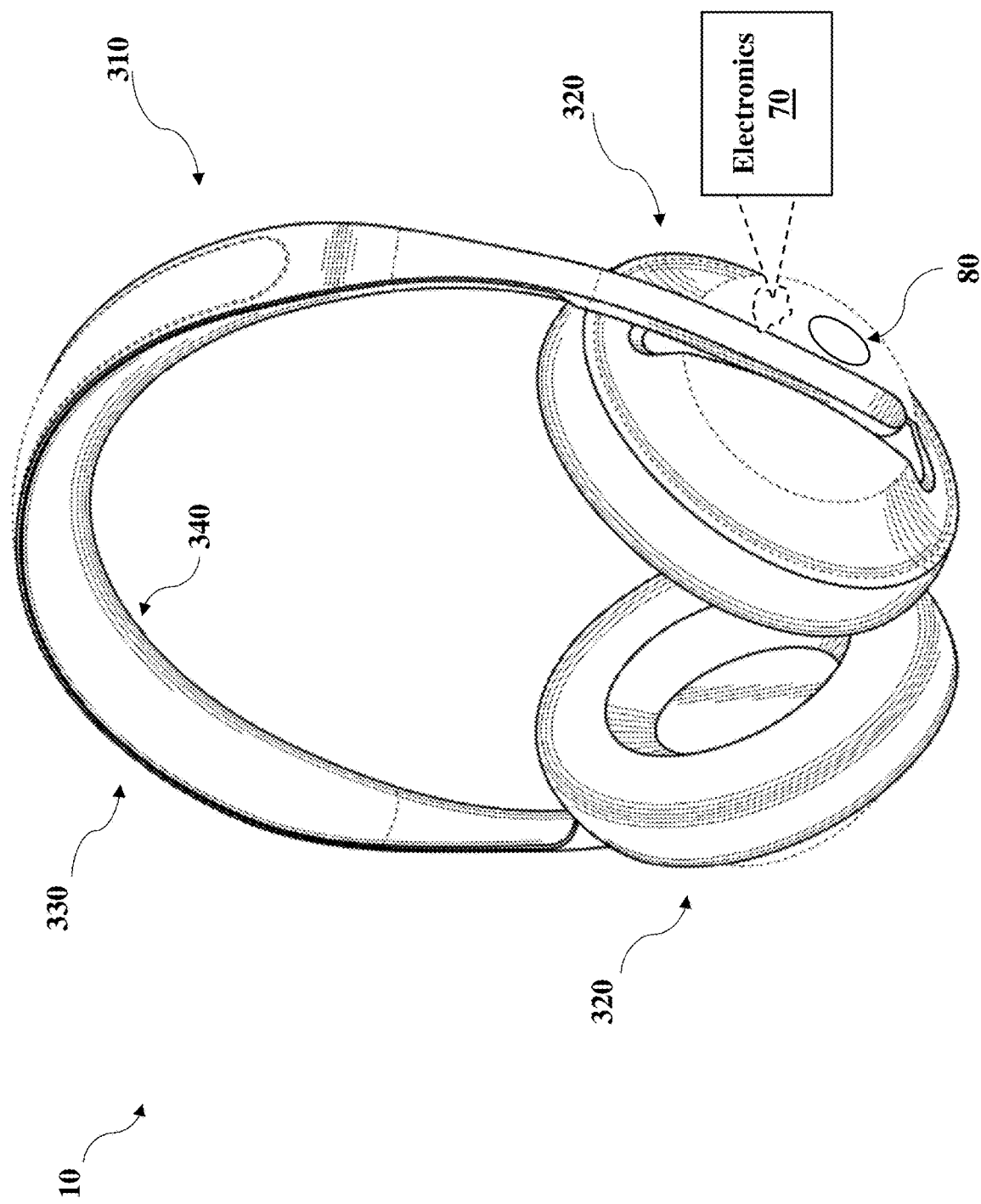
FIG. 3 is a schematic depiction of another wearable audio device according to various implementations.

FIGS. 1-3 illustrate examples of wearable audio devices that may incorporate the teachings of the various implementations. These examples are not intended to be limiting.

FIG. 1 is a schematic depiction of a first example wearable audio device 10. In this example, the wearable audio device 10 is an audio headset 20 having at least one earbud (or, in-ear headphone) 30. Two earbuds 30 are illustrated in this example. While the earbuds 30 are shown in a "true" wireless configuration (i.e., without tethering between earbuds 30), the audio headset 20 could also include a tethered wireless configuration (whereby the earbuds 30 are connected via wire with a wireless connection to a playback device) or a wired configuration (whereby at least one of the earbuds 30 has a wired connection to a playback device). Each earbud 30 is shown including a body 40, which can include a casing formed of one or more plastics or composite materials. The body 40 can include a nozzle 50 for insertion into a user's ear canal entrance, a support member 60 for retaining the nozzle 50 in a resting position within the user's ear, and an outer casing 65 for housing electronics 70, including components of a capacitive touch interface 80. In some cases, separate, or duplicate sets of electronics 70 are contained in portions of the earbuds 30, e.g., each of the respective earbuds 30. However, certain components described herein can also be present in singular form.

FIG. 2 depicts an additional example wearable audio device 10, including audio eyeglasses 210. As shown, the audio eyeglasses 210 can include a frame 220 having a lens region 230 and a pair of arms 240 extending from the lens region 230. As with conventional eyeglasses, the lens region 230 and arms 240 are designed for resting on the head of a user. The lens region 230 can include a set of lenses 250, which can include prescription, non-prescription and/or light-filtering lenses, as well as a bridge 260 (which may include padding) for resting on the user's nose. Arms 240 can include a contour 265 for resting on the user's respective ears. Contained within the frame 220 (or substantially contained, such that a component can extend beyond the boundary of the frame) are electronics 70 and other components for controlling the audio eyeglasses 210 according to particular implementations. Electronics 70 can include portions of a capacitive touch interface 80, as described with respect to the wearable audio devices 10 herein. In some cases, separate, or duplicate sets of electronics 70 are contained in portions of the frame, e.g., each of the respective arms 240 in the frame 220. However, certain components described herein can also be present in singular form.

FIG. 3 depicts another wearable audio device 10, including around-ear headphones 310. Headphones 310 can include a pair of earcups 320 configured to fit over the ear, or on the ear, of a user. A headband 330 spans between the pair of earcups 320 and is configured to rest on the head of the user (e.g., spanning over the crown of the head or around the head). The headband 330 can include a head cushion 340 in some implementations. Stored within one or both of the earcups 320 are electronics 70 and other components for controlling the headphones 310 according to particular implementations. Electronics 70 can include portions of a capacitive touch interface 80, as described with respect to the wearable audio devices 10 herein. It is understood that a number of wearable audio devices described herein can utilize the features of the various implementations, and the wearable audio devices 10 shown and described with reference to FIGS. 1-3 are merely illustrative.

Figure 4:
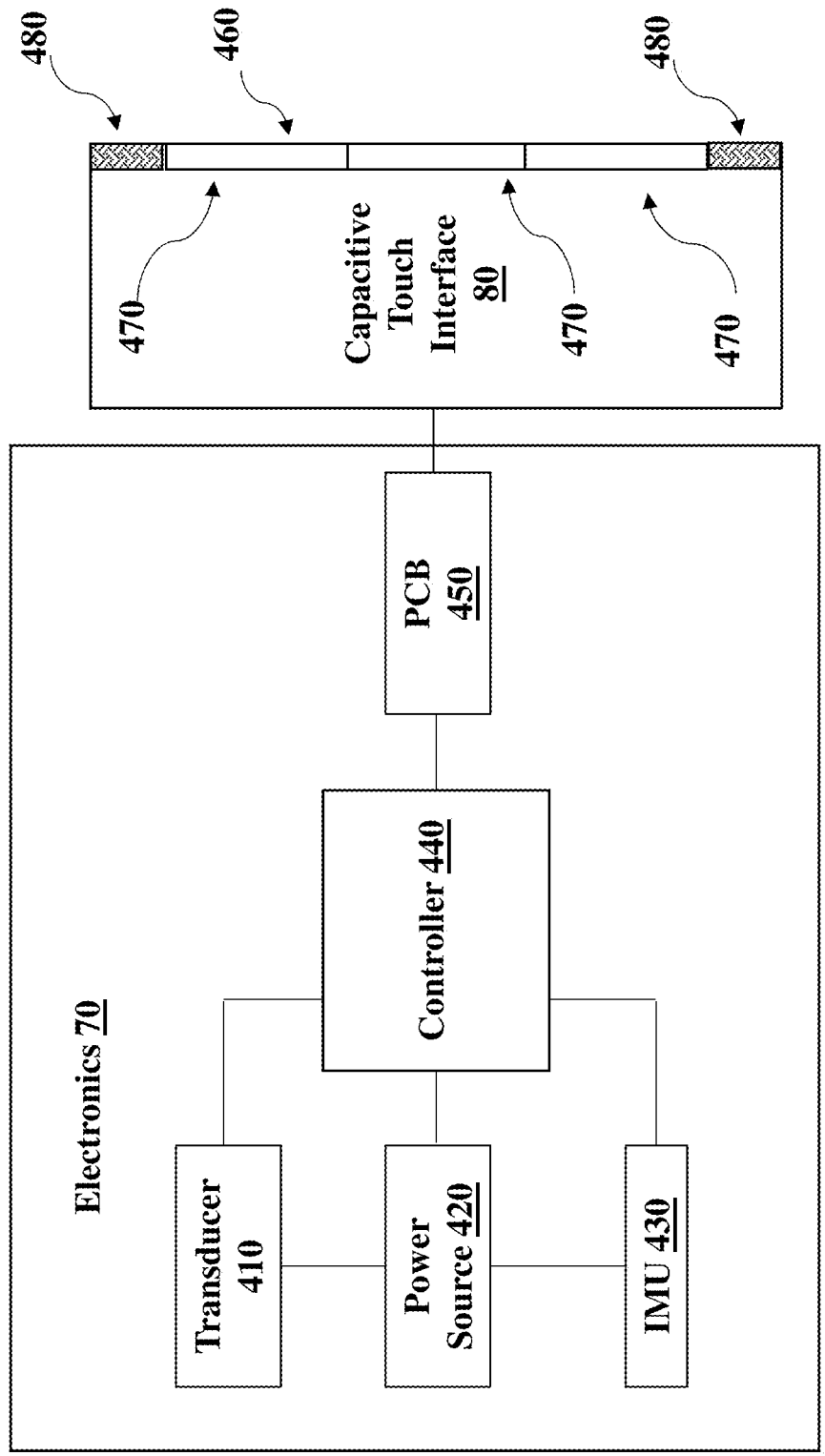
FIG. 4 is a system diagram illustrating electronics and a connected capacitive touch interface within the wearable audio devices of FIGS. 1-3 according to various implementations.

FIG. 4 shows a schematic depiction of the electronics 70 contained (at least partially) within the wearable audio devices 10 (e.g., as shown in FIGS. 1-3), along with components of the capacitive touch interface (CTI) 80. It is understood that one or more of the components in electronics 70 may be implemented as hardware and/or software, and that such components may be connected by any conventional means (e.g., hard-wired and/or wireless connection). It is further understood that any component described as connected or coupled to another component in the wearable audio device 10 or other systems disclosed according to implementations may communicate using any conventional hard-wired connection and/or additional communications protocols. In some cases, communications protocol(s) can include a Wi-Fi protocol using a wireless local area network (LAN), a communication protocol such as IEEE 802.11 b/g a cellular network-based protocol (e.g., third, fourth or fifth generation (3G, 4G, 5G cellular networks) or one of a plurality of internet-of-things (IoT) protocols, such as: Bluetooth, BLE Bluetooth, ZigBee (mesh LAN), Z-wave (sub-GHz mesh network), 6LoWPAN (a lightweight IP protocol), LTE protocols, RFID, ultrasonic audio protocols, etc. In various particular implementations, separately housed components in wearable audio device 10 are configured to communicate using one or more conventional wireless transceivers.

As shown in FIG. 4, electronics 70 contained within the audio headset 20 (FIG. 1) can include a transducer 410 and a power source 420. In certain implementations, the electronics 70 can further include an inertial measurement unit (IMU) 430 for detecting movement of the wearable audio device 10 and enabling particular control functions. In various implementations, the power source 420 is connected to the transducer 410, and can additionally be connected to the IMU 430. Each of the transducer 410, power source 420 and IMU 90 are connected with a controller 440, which is configured to perform control functions according to various implementations described herein. Electronics 70 can include other components not specifically depicted in the accompanying FIGURES, such as communications components (e.g., a wireless transceiver (WT)) configured to communicate with one or more other electronic devices connected via one or more wireless networks (e.g., a local WiFi network, Bluetooth connection, or radio frequency (RF) connection), and amplification and signal processing components. It is understood that these components or functional equivalents of these components can be connected with, or form part of, the controller 440.

The transducer 410 can include at least one electroacoustic transducer for producing an acoustic output into, or proximate, the ears of a user. In certain implementations (e.g., in the audio eyeglasses example of FIG. 2), each transducer 410 can include a dipole loudspeaker with an acoustic driver or radiator that emits front-side acoustic radiation from its front side, and emits rear-side acoustic radiation to its rear side. The dipole loudspeaker can be built into the housing, frame or casing of the wearable audio device 10, and may be configured for the particular form factor of the wearable audio device 10.

The IMU 430 can include a microelectromechanical system (MEMS) device that combines a multi-axis accelerometer, gyroscope, and/or magnetometer. It is understood that additional or alternative sensors may perform functions of the IMU 430, e.g., an optical-based tracking system, accelerometer, magnetometer, gyroscope or radar for detecting movement as described herein. The IMU 430 can be configured to detect changes in the physical location/orientation of the wearable audio device 10, and provide updated sensor data to the controller 440 in order to indicate a change in the location/orientation of the wearable audio device 10. However, it is understood that the electronics 70 could also include one or more optical or visual detection systems located at the wearable audio device 10 or another connected device configured to detect the orientation of the wearable audio device 10.

The power source 420 to the transducer 410 can be provided locally (e.g., with a battery proximate each transducer 410), or a single battery can transfer power via wiring (not shown) that passes through the frame or housing of the wearable audio device 10, e.g., depending upon the form factor of the particular wearable audio device 10. The power source 420 can be used to control operation of the transducer 410, according to various implementations.

The controller 440 can include conventional hardware and/or software components for executing program instructions or code according to processes described herein. For example, controller 440 may include one or more processors, memory, communications pathways between components, and/or one or more logic engines for executing program code. Controller 440 can be coupled with other components in the electronics 70 via any conventional wireless and/or hardwired connection which allows controller 440 to send/receive signals to/from those components and control operation thereof.

Controller 440 is shown coupled with a printed circuit board (PCB) 450, which in turn is coupled with the capacitive touch interface 80 (FIGS. 1-3). In some case, the PCB 450 and/or components of the capacitive touch interface 80 are enclosed in a common housing with the electronics 70, however, these components can be physically separated by one or more partitions in other implementations. The controller 440 is configured to receive touch-based commands from the capacitive touch interface 80 in order to control operation of the wearable audio device 10. For example, a user can provide a touch command at the capacitive touch interface 80 in order to power the wearable audio device 10 on or off, switch between playback sources, switch tracks or segments within a playback source, toggle through a menu of playback options, etc.

The capacitive touch interface 80 is shown including a contact surface 460 for receiving the touch command (e.g., from a user such as a human user), and a set of at least two electrodes 470 underlying the contact surface 460 for detecting the touch command at the contact surface 460. Three electrodes 470 are illustrated in a cross-sectional view of the capacitive touch interface 80 in FIG. 4, however, it is understood that any number of electrodes 470 greater than (2) can form part of the interface. Electrodes 470 can include a sensor pad, and can be connected through the PCB 450 to the controller 440 by one or more via and/or trace connections to an I/O pin coupled with the controller 440. Electrodes 470 can be surrounded or otherwise isolated by a ground hatch 480. As is known in the art, when a user (e.g., a user's finger) touches the contact surface of a capacitive touch interface (e.g., contact surface 460 of capacitive touch interface 80), it forms a simple parallel plate capacitor, whose digital value is measured and used to detect presence at the particular electrode and/or movement across electrodes (such as in a swiping motion).

Having two or more electrodes permits detection of movement across the interface 80, significantly increasing the number of available commands from a single-electrode interface. While conventional capacitive touch interfaces use multiple electrodes to detect movement across an interface, these conventional electrode configurations include electrodes separated from neighboring electrodes by linear borders. That is, these conventional interfaces have electrodes with border profiles that are linear or approximate a linear border.

Figure 5:
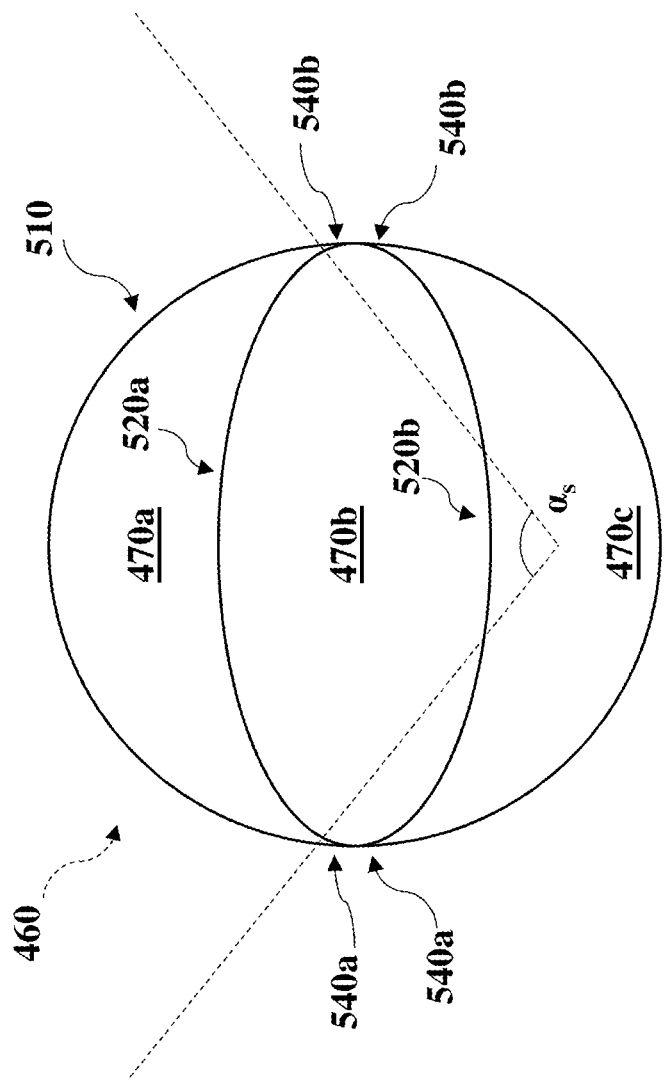
FIG. 5 illustrates a capacitive touch interface according to various implementations.

FIG. 5 illustrates an example plan view of electrodes 470 underlying the contact surface 460 of FIG. 4. As will be described further herein, various configurations of electrodes 470 are possible according to the disclosed implementations, only a few of which are illustrated as examples. FIG. 5 shows an approximately circular or elliptical shaped contact surface 460, defined by a perimeter 510. In this example implementation, the set of (two or more) electrodes are shaped such that neighboring electrodes 470*a*, 470*b*, 470*c* in the set share a border 520*a*, 520*b* having an arcuate profile across the contact surface. That is, each border 520*a*, 520*b* contacts the perimeter 510 at two distinct locations 540*a*, 540*b* and has a non-linear, arcuate profile. More particularly, the border 520*a*, 520*b* between adjacent electrodes 470*a*, 470*b* and 470*b*, 470*c* at the contact surface 460 follows an arcuate path (and does not follow a linear path) from its first point of contact with the perimeter 510 (location 540*a*) to its second point of contact with the perimeter 510 (location 540*b*). In certain implementations, the arcuate profiles can have inverted arc directions with respect to one another (e.g., arc directions opposing one another).

Figure 6:
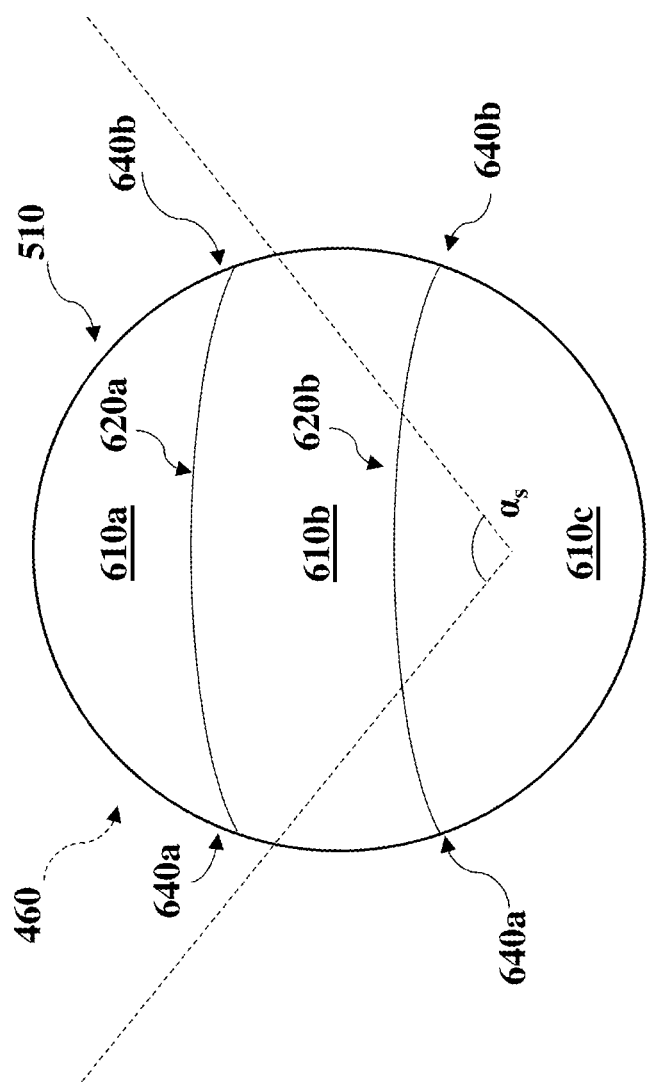
FIG. 6 illustrates a capacitive touch interface according to various additional implementations.

However, as shown with respect to the example plan view of perimeter 510 in FIG. 6, electrodes 610 (neighboring electrodes 610*a*, 610*b*, 610*c*) can be separated by borders 620*a*, 620*b* with arcuate profiles having a common arc direction with respect to the perimeter 510. In certain implementations, these borders 620*a*, 620*b* have an equal or approximately equal arc radius, however, these borders 620*a*, 620*b* may also have distinct arc radii. These borders may span from a first point of contact with perimeter 510 (location 640*a*) to a second point of contact with perimeter 510 (location 640*b*).

Figure 7:
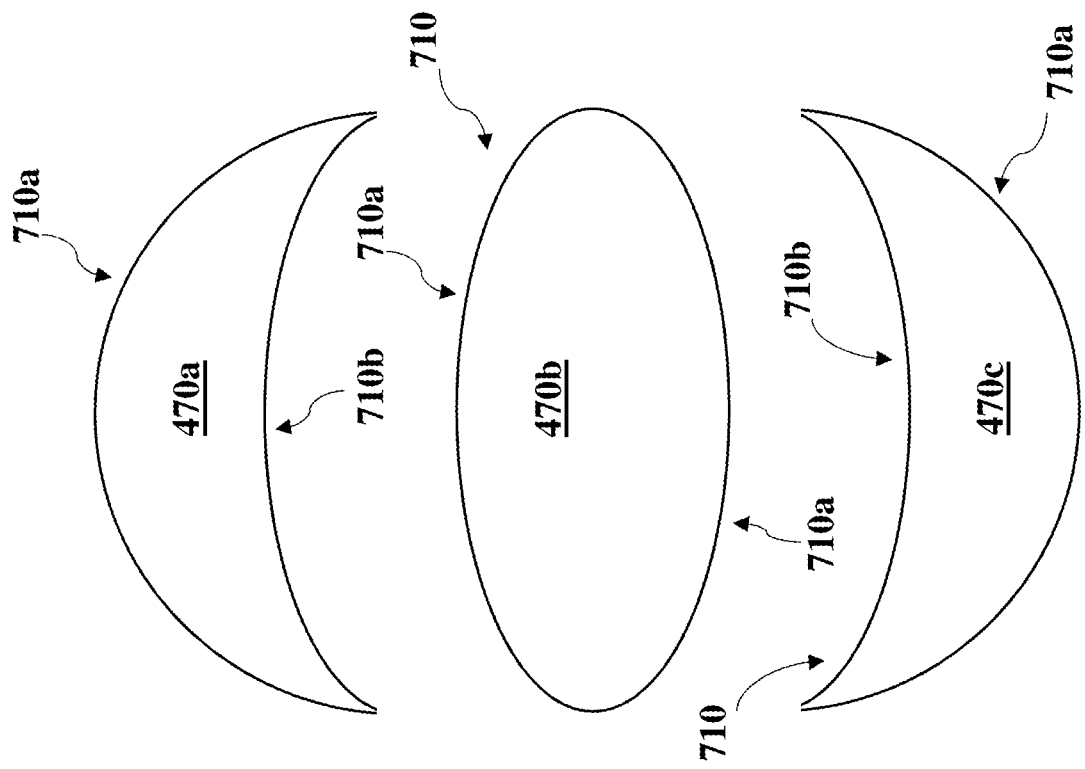
FIG. 7 illustrates another capacitive touch interface according to various implementations.

FIG. 7 illustrates the three electrodes 470*a*, 470*b* and 470*c* of FIG. 5 in isolated plan view, illustrating the arcuate sidewalls 710 of each of those electrodes. In particular, as shown in this plan view, electrode 470*a* has an arcuate convex sidewall 710*a* and an opposing, arcuate concave sidewall 710*b*, while electrode 470*b* has two opposing arcuate convex sidewalls 710*a* and electrode 470*c* has an arcuate convex sidewall 710*a* and an opposing, arcuate concave sidewall 710*b*. As illustrated in FIG. 7 (as well as FIGS. 5 and 6), the sidewalls of directly neighboring electrodes (e.g., 470*a*, 470*b*) can have complementary profiles.

Returning to FIGS. 5 and 6, in various implementations, the contact surface 460 is sized according to the form factor of the wearable audio device 10 (FIGS. 1-3). In particular cases, this means the contact surface 460 will be smaller than the broadest surface on the wearable audio device 10. Additionally, the contact surface 460 is located on a surface which provides the user with relatively easy access to perform touch commands. For example, in the case of the earbuds 30 in FIG. 1, the contact surface 460 is no larger than the outer surface of the housing 40 (e.g., a face of outer housing 65). In one particular example, the contact surface 460 (as defined by perimeter 510) has an area of less than approximately 90-130 square millimeters (mm) (e.g., a circular contact surface with a radius of approximately 6 mm). However, this is only one example range for the size of contact surface 460.

The range of at which a sliding (also called swiping) command can be detected across adjacent electrodes is referred to as the slide angle of the interface. In various implementations, the contact surface 460 is aligned on the wearable audio device 10 to detect a touch command across adjacent electrodes (e.g., 470*a*, 470*b*, 470*c* or 610*a*, 610*b*, 610*c*) using a vertical or horizontal sliding (or swiping) gesture (relative to a ground surface). In this sense, the contact surface 460 is designed to enable the user to easily slide/swipe in a direction to initiate particular commands.

Due to the wearable nature of the audio device 10 upon which the capacitive touch interface 80 is located, the user is often not looking at the contact surface 460 when making a touch command (e.g., swiping gesture) at the interface. Additionally, due to the wearable nature of the audio device 10, the wearable audio device 10 is often oriented in a direction that is not exactly normal to the ground or other flat surface. This can make it difficult for users to effectively perform their intended directionally-based touch commands. For example, a user wearing the earbuds 30 shown in FIG. 1 may intend to make a vertical swiping gesture (contacting at least two electrodes) across the contact surface 460, but may in fact be swiping at an angle which deviates significantly from the vertical orientation of the contact surface 460 on the earbuds 30 e.g., due to the fit of the earbuds in her ear, the orientation of her head relative to the ground and/or the trajectory of her finger as she makes the swiping gesture (without seeing the contact surface 460).

As descried herein, conventional capacitive touch interfaces with multiple electrodes capable of detecting swiping or sliding gestures have linear electrode borders along the contact surface, or borders approximating a straight line (e.g., sinusoids or saw-tooth borders tightly centered around a straight line) along the contact surface. These linear borders limit the slide angle of conventional interfaces. That is, in the case of linear borders, the end points of those borders geometrically define the range of sliding angles. This limits the available slide angle of those conventional interfaces. This narrow slide angle can be particularly limiting where the capacitive touch interface has a small contact surface area, where the user does not see the interface when making a command gesture and where the device on which the interface is located is not uniformly aligned. These challenges can all exist in wearable audio devices.

In comparison to conventional capacitive touch interfaces, the contact surface (e.g., contact surface 460 in FIG. 5 and FIG. 6) disclosed according to various implementations can provide an enhanced slide angle (also referred to as a maximum slide angle) for touch commands (e.g., sliding or swiping gestures). For example, the electrode configurations shown in FIGS. 5 and 6 can provide a maximum slide angle ($\alpha_s$) for a touch command that is greater than the maximum slide angle for conventional capacitive touch interfaces. In one particular example implementation, as discussed with reference to FIGS. 11 and 12, the maximum slide angle ($\alpha_s$) for a touch command is greater than a reference slide angle for a reference contact surface having electrodes with border profiles that are linear or approximate a linear border. This slide angle can be indexed to the ground surface, or another surface substantially parallel with the ground surface. In the example of a vertical swiping gesture by a user (vertical relative to ground), the contact surface 460 provides a wide maximum slide angle ($\alpha_s$) to detect such a gesture. This can be particularly beneficial in the case of the wearable audio device 10, which may be positioned in a number of ways depending upon the user's body or head position, and may not be directly visible to the user.

Figure 8:
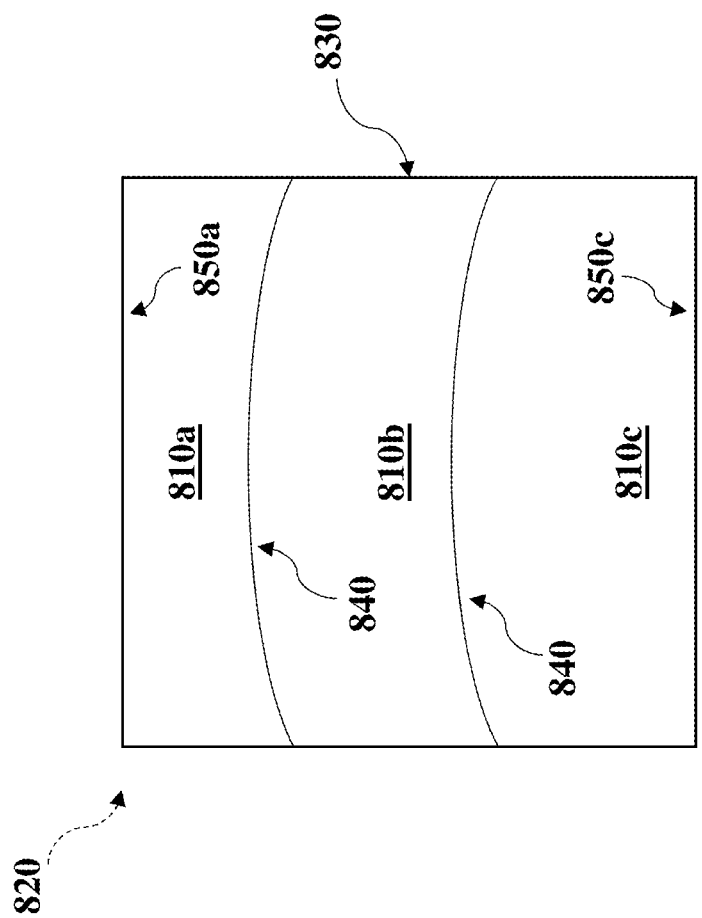
FIG. 8 illustrates an additional capacitive touch interface according to various implementations.
Figure 9:
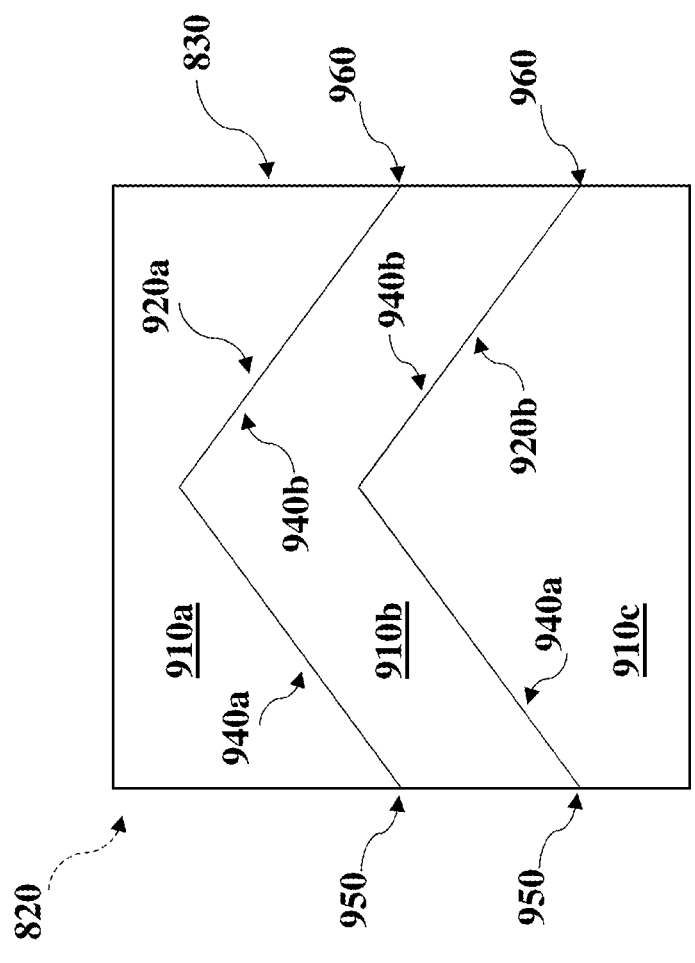
FIG. 9 illustrates a capacitive touch interface according to particular additional implementations.
Figure 10:
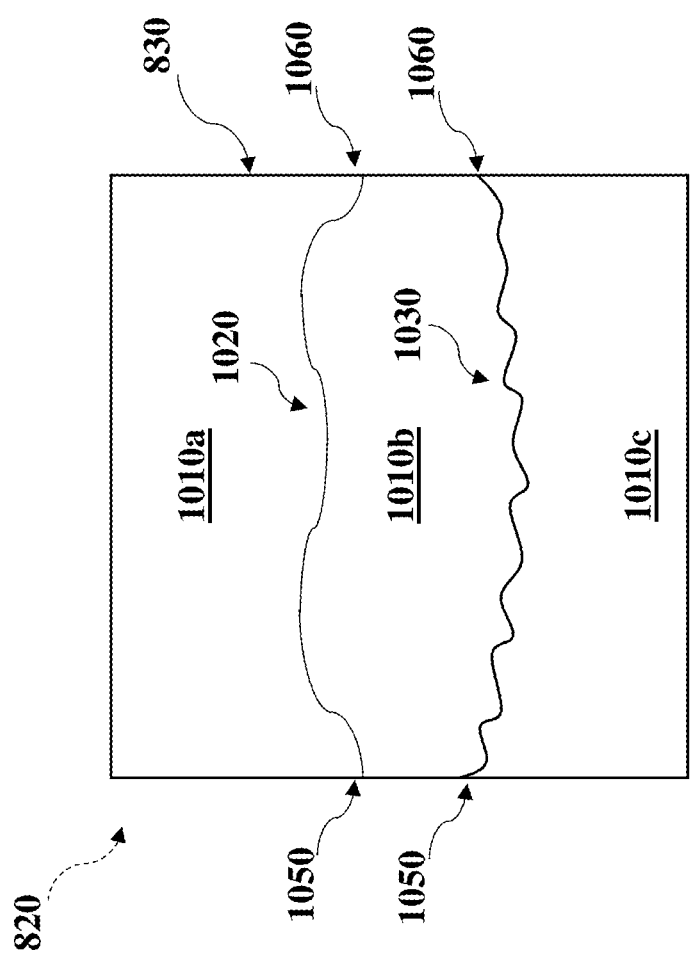
FIG. 10 illustrates another capacitive touch interface according to various implementations.

While the perimeter 510 shown in the example implementations of contact surface 460 is shaped as a circular or an ellipse, it is understood that this perimeter can take other forms. For example, FIGS. 8-10 illustrate additional implementations including electrodes arranged below a contact surface defined by a non-circular shaped perimeter, e.g., a rectangular-shaped perimeter. In particular, FIG. 8 shows an example implementation with electrodes 810 (810a, 810b, 810c) arranged below a contact surface 820 defined by a rectangular-shaped perimeter 830. In these cases, the border 840 between adjacent electrodes 810 can take the form of any electrode border described herein. Additionally, one or more sidewalls of the electrodes 810 may have a linear profile relative to the contact surface 820, e.g., sidewalls 850a and 850b of electrodes 810a and 810c.

In additional implementations, the border between adjacent electrodes can take other forms which are non-linear and do not approximate a linear path. For example, FIGS. 9 and 10 depict examples of electrodes 910a, 910b, 910c and electrodes 1010a, 1010b, 1010c (FIG. 10) within the rectangular-shaped perimeter 830. In both of these example implementations, borders between electrodes 910a, 910b, 910c and 1010a, 1010b, 1010c have a piecewise profile approximating a non-linear path across the contact surface 820.

With particular reference to FIG. 9, electrodes 910a, 910b, 910c are separated by borders 920a, 920b each having a piecewise profile relative to the contact surface 820. As with other example implementations illustrated herein, the piecewise profiles of borders 920a, 920b may have a same or similar orientation (as shown), or may have an inverted orientation relative to one another. In any case, the piecewise profiles each include at least two continuous segments 940a, 940b with distinct orientations (e.g., angles relative to one another or the perimeter 830) that approximate a non-linear path across the contact surface 820. That is, the piecewise profile 930 includes distinct segments 940a, 940b that collectively span an entire dimension of the contact surface 820 (e.g., a width as shown in FIG. 9) but do not form a single linear path from one end 950 to another end 960. The example chevron-shaped profile in FIG. 9 is only one example of a piecewise profile used to form borders according to various implementations. FIG. 10 illustrates two additional example piecewise profiles separating distinct electrodes. As illustrated in FIG. 10, in some cases, neighboring electrodes 1010a, 1010b, 1010c can be separated by borders 1020 and 1030 having distinct profile types. For example, two distinct piecewise profiles are illustrated in borders 1020 and 1030, where profile 1020 includes a meandering profile and profile 1030 includes a saw tooth-shaped profile along an arcuate path. It is understood that the meandering profile can take any piecewise form approximating a non-linear path across the contact surface 820 (from one end 1050 to another end 1060). Additionally, other piecewise profiles can be employed according to various implementations, e.g., a sinusoidal profile approximating an arcuate path, or an uneven zig-zag profile approximating an arcuate path.

It is further understood that the piecewise profile example implementations shown and described with respect to FIGS. 9 and 10 are equally applicable to contact surfaces having non-rectangular shapes (e.g., contact surface 460 or other rounded or ellipse-shaped contact surfaces).

Figure 11:
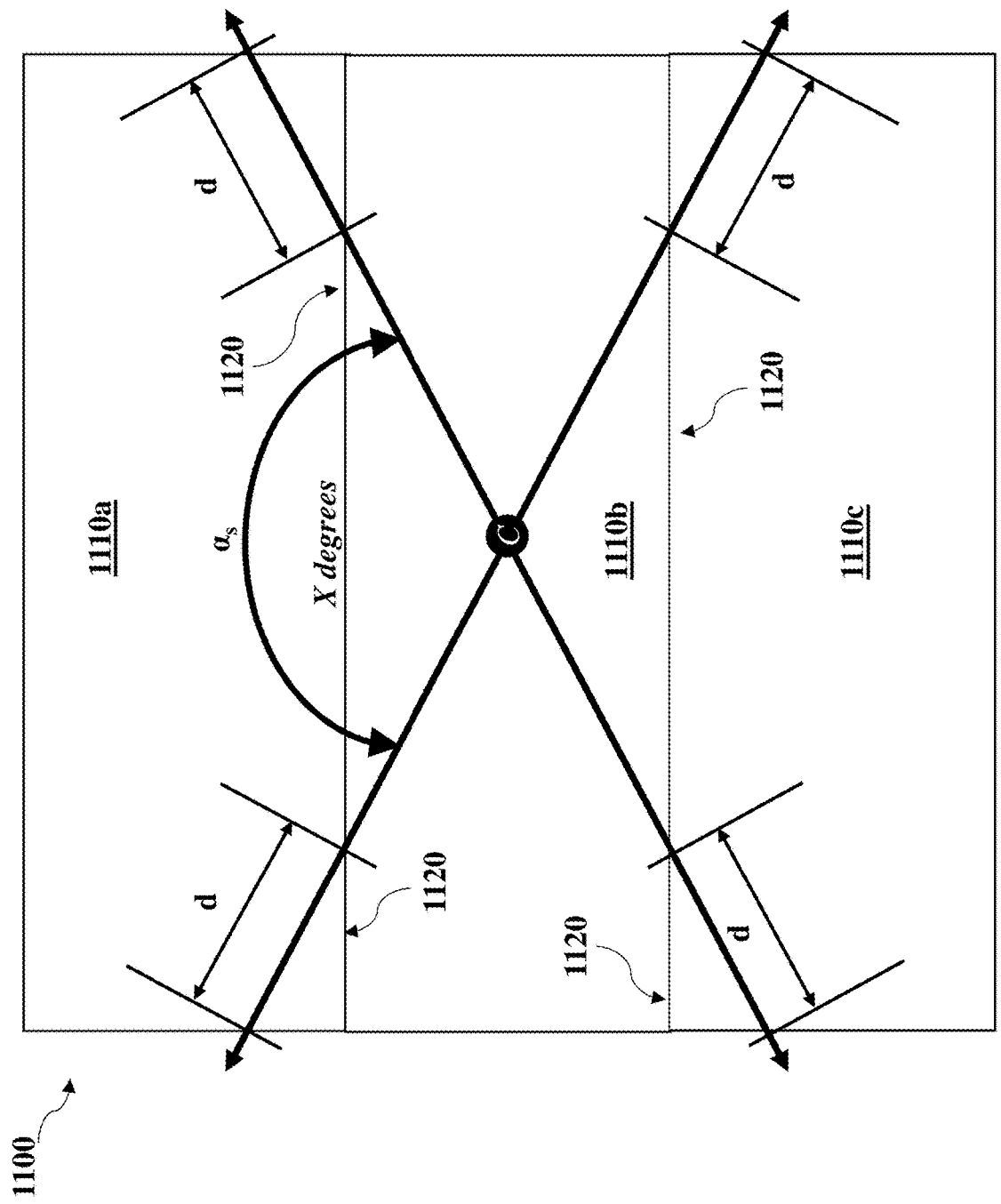
FIG. 11 illustrates a reference contact surface in a conventional capacitive touch interface.
Figure 12:
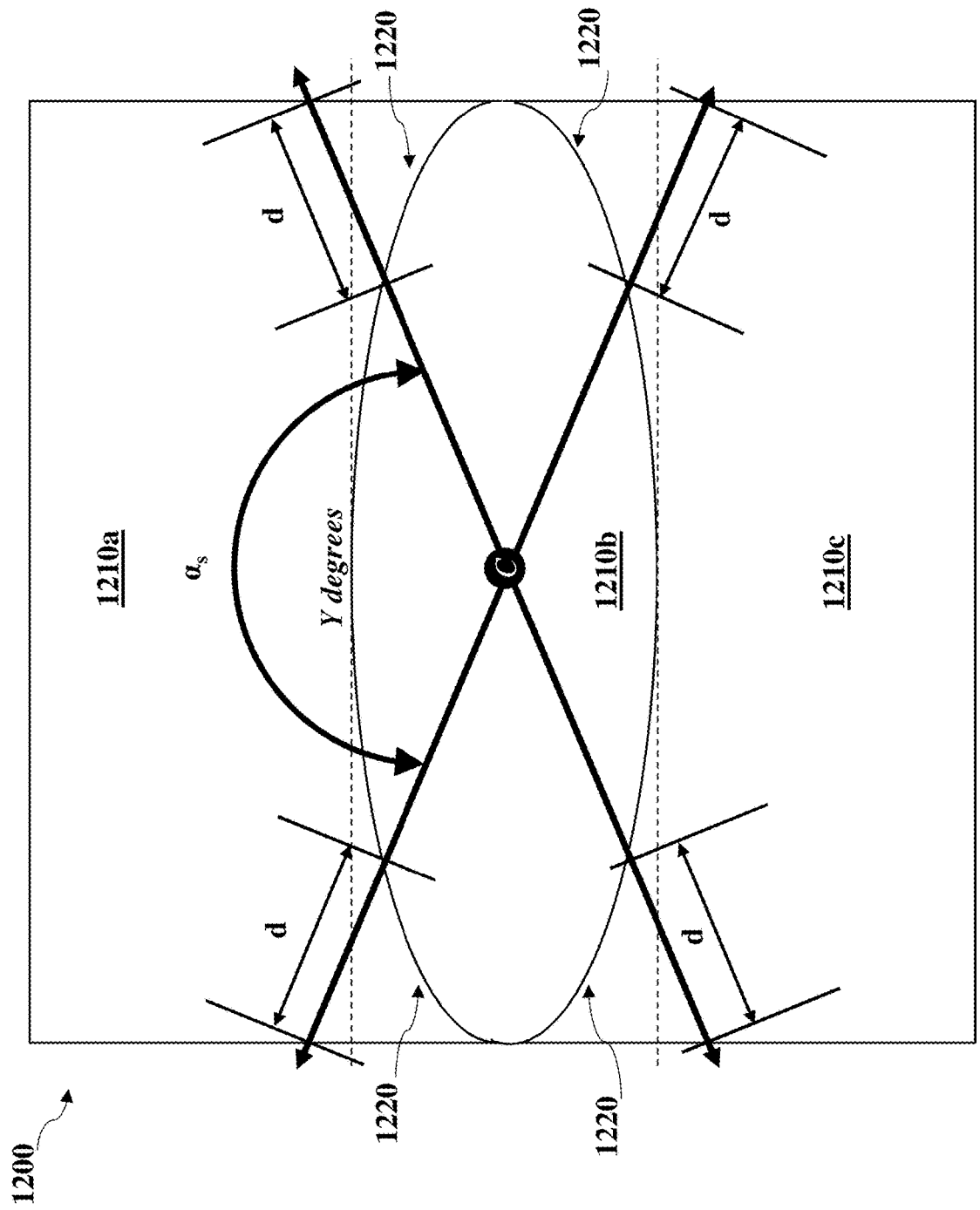
FIG. 12 illustrates a contact surface in a capacitive touch interface according to various implementations.

For example, FIGS. 11 and 12 illustrate the comparison between contact surfaces shown and described herein and a reference contact surface 1100 (FIG. 11) in terms of maximum slide angle ($\alpha_s$) for gesture detection. FIG. 11 illustrates one example reference contact surface 1100, while FIG. 12 illustrates an example contact surface 1200 according to various implementations. Both the reference contact surface 1100 and the contact surface 1200 have a rectangular-shaped perimeter (as discussed according to various implementations herein). Three electrodes are shown in each of these examples. However, in contrast to the reference contact surface 1100, contact surface 1200 includes electrodes 1210 that share a border having an arcuate profile 1220 across the contact surface 1200. The reference contact surface 1100, as shown, has electrodes 1110 with border profiles 1120 that are linear.

The center of each contact surface 1100, 1200, is marked with a point (C), while two distinct linear swiping (gesture) directions are indicated by the bold arrows crossing through the center (C). In this example configuration, each linear swiping action travels at least a distance (d) within each electrode zone to be detected by the respective electrodes 1110, 1210. In this example, when the swiping action is linear and the distance travelled within each zone meets the minimum distance (e.g., distance (d)), the maximum slide angle ($\alpha_s$) for each configuration is significantly distinct. That is, the maximum slide angle ($\alpha_s$) for contact surface 1100 in FIG. 11 is shown as X degrees, while the maximum slide angle ($\alpha_s$) for contact surface 1200 in FIG. 12 is shown as the larger angle, indicated as Y degrees. This greater maximum slide angle, as described herein, is caused by the electrode and electrode border shapes shown and described according to various particular implementations. This comparison shown in FIGS. 11 and 12 is intended merely to illustrate various features of the disclosed implementations when compared with conventional configurations. These figures are not intended to limit the various implementations described herein.

In any case, as noted herein the wearable audio device 10 including a capacitive touch interface according to various implementations can improve the maximum slide angle in touch commands for such devices, significantly improving the user experience when compared with conventional devices.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

Elements of figures are shown and described as discrete elements in a block diagram. These may be implemented as one or more of analog circuitry or digital circuitry. Alternatively, or additionally, they may be implemented with one or more microprocessors executing software instructions. The software instructions can include digital signal processing instructions. Operations may be performed by analog circuitry or by a microprocessor executing software that performs the equivalent of the analog operation. Signal lines may be implemented as discrete analog or digital signal lines, as a discrete digital signal line with appropriate signal processing that is able to process separate signals, and/or as elements of a wireless communication system.

When processes are represented or implied in the block diagram, the steps may be performed by one element or a plurality of elements. The steps may be performed together or at different times. The elements that perform the activities may be physically the same or proximate one another, or may be physically separate. One element may perform the actions of more than one block. Audio signals may be encoded or not, and may be transmitted in either digital or analog form. Conventional audio signal processing equipment and operations are in some cases omitted from the drawings.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

I claim:

1. A wearable audio device comprising: an acoustic transducer comprising a sound-radiating surface for providing an audio output; a controller coupled with the acoustic transducer; a printed circuit board (PCB) coupled with the controller; and a capacitive touch interface coupled with the PCB, the capacitive touch interface comprising: a contact surface for receiving a touch command; and a set of at least two electrodes underlying the contact surface for detecting the touch command at the contact surface, wherein neighboring electrodes in the set share a border comprising an arcuate profile across the contact surface, wherein the set of at least two electrodes comprises at least three electrodes with respective borders between the neighboring electrodes, wherein the borders between the neighboring electrodes in the at least three electrodes comprise an arcuate profile and have a common arc direction, wherein the contact surface achieves a maximum slide angle for the touch command that is greater than a reference slide angle for a reference contact surface having electrodes with border profiles that are linear or approximate a linear border, and wherein the touch command comprises an approximately vertical swiping gesture by a user relative to a ground surface, wherein the wearable audio device comprises at least one of: audio eyeglasses, an earbud, an audio hat, an audio visor, audio jewelry or a neck-worn speaker system.

2. The wearable audio device of claim 1, wherein the contact surface further comprises a perimeter, and wherein the border between the neighboring electrodes contacts the perimeter at two distinct locations.

3. The wearable audio device of claim 1, wherein the contact surface has a perimeter shaped as a circle, an ellipse or a rectangle.

4. The wearable audio device of claim 1, wherein the contact surface has an area of less than approximately 90-130 square millimeters.

5. An audio headset comprising: an acoustic transducer comprising a sound-radiating surface for providing an audio output; a controller coupled with the acoustic transducer; a printed circuit board (PCB) coupled with the controller; and a capacitive touch interface coupled with the PCB, the capacitive touch interface comprising: a contact surface for receiving a touch command; and a set of at least two electrodes underlying the contact surface for detecting the touch command at the contact surface, wherein neighboring electrodes in the set share a border comprising an arcuate profile across the contact surface or a piecewise profile approximating a non-linear path across the contact surface, wherein the piecewise profile comprises at least one of: a chevron-shaped profile, a sinusoidal profile along an arcuate path, a saw tooth-shaped profile along an arcuate path or a meandering profile, wherein the contact surface achieves a maximum slide angle for the touch command that is greater than a reference slide angle for a reference contact surface having electrodes with border profiles that are linear or approximate a linear border, and wherein the touch command comprises an approximately vertical swiping gesture by a user relative to a ground surface, wherein the audio headset comprises at least one of: audio eyeglasses, an earbud, an audio hat, an audio visor, audio jewelry or a neck-worn speaker system.

6. The audio headset of claim 5, wherein the contact surface further comprises a perimeter, and wherein the border between the neighboring electrodes contacts the perimeter at two distinct locations.

7. The audio headset of claim 5, wherein the set of at least two electrodes comprises at least three electrodes with respective borders between the neighboring electrodes.

8. The audio headset of claim 5, wherein the contact surface has a perimeter shaped as a circle, an ellipse or a rectangle.

9. The audio headset of claim 5, wherein the earbud is sized to rest within an ear of a user.

10. The audio headset of claim 9, wherein the contact surface has an area of less than approximately 90-130 square millimeters.

11. A wearable audio device comprising: an acoustic transducer comprising a sound-radiating surface for providing an audio output; a controller coupled with the acoustic transducer; a printed circuit board (PCB) coupled with the controller; and a capacitive touch interface coupled with the PCB, the capacitive touch interface comprising: a contact surface for receiving a touch command; and a set of at least two electrodes underlying the contact surface for detecting the touch command at the contact surface, wherein neighboring electrodes in the set share a border comprising an arcuate profile across the contact surface or a piecewise profile approximating a non-linear path across the contact surface, wherein the contact surface has an area of less than approximately 90-130 square millimeters, wherein the piecewise profile comprises at least one of: a chevron-shaped profile, a sinusoidal profile along an arcuate path, a saw tooth-shaped profile along an arcuate path or a meandering profile, and wherein the contact surface achieves a maximum slide angle for the touch command that is greater than a reference slide angle for a reference contact surface having electrodes with border profiles that are linear or approximate a linear border, wherein the touch command comprises an approximately vertical swiping gesture by a user relative to a ground surface, wherein the wearable audio device comprises at least one of: audio eyeglasses, an earbud, an audio hat, an audio visor, audio jewelry or a neck-worn speaker system.

12. The wearable audio device of claim 11, wherein the contact surface has a perimeter shaped as a circle, an ellipse or a rectangle.

13. The wearable audio device of claim 11, wherein the piecewise profile comprises at least one of: a chevron-shaped profile, a sinusoidal profile along an arcuate path, or a meandering profile.

\* \* \* \* \*